(12) United States Patent
Ambrosi et al.

(10) Patent No.: US 11,200,948 B1
(45) Date of Patent: Dec. 14, 2021

(54) SYSTEM FOR A FLEXIBLE CONDUCTANCE CROSSBAR

(71) Applicant: HEWLETT PACKARD ENTERPRISE DEVELOPMENT LP, Houston, TX (US)

(72) Inventors: Joao Claudio Ambrosi, Porto Alegre (BR); Arthur Carvalho Walraven Da Cunha, Porto Alegre (BR); Jefferson Rodrigo Alves Cavalcante, Porto Alegre (BR)

(73) Assignee: Hewlett Packard Enterprise Development LP, Houston, TX (US)

( * ) Notice: Subject to any disclaimer, the term of this patent is extended or adjusted under 35 U.S.C. 154(b) by 0 days.

(21) Appl. No.: 17/005,219

(22) Filed: Aug. 27, 2020

(51) Int. Cl.
| | |
|---|---|
| *G11C 13/00* | (2006.01) |
| *G06N 3/02* | (2006.01) |
| *H01L 45/00* | (2006.01) |
| *G11C 5/02* | (2006.01) |
| *H01L 27/24* | (2006.01) |

(52) U.S. Cl.
CPC .......... *G11C 13/0007* (2013.01); *G06N 3/02* (2013.01); *G11C 5/025* (2013.01); *G11C 13/004* (2013.01); *H01L 27/24* (2013.01); *H01L 45/145* (2013.01)

(58) Field of Classification Search
CPC ... G11C 13/0007; G11C 13/004; G11C 5/025; G06N 3/02; H01L 45/145; H01L 27/24
USPC .................................................. 365/148, 158
See application file for complete search history.

(56) References Cited

U.S. PATENT DOCUMENTS

| | | | |
|---|---|---|---|
| 4,377,856 A * | 3/1983 | Roesner ................ G11C 11/412 |
| | | | 327/208 |
| 10,074,050 B2 | 9/2018 | Kataeva et al. | |
| 10,079,058 B1 | 9/2018 | Eleftheriou et al. | |
| 10,482,940 B2 | 11/2019 | Hu et al. | |
| 10,804,324 B1 * | 10/2020 | Zhang ................ H01L 27/2481 |
| 10,867,239 B2 * | 12/2020 | Gupta ..................... G06F 15/00 |
| 10,930,348 B1 * | 2/2021 | Li ........................ G11C 11/4087 |

(Continued)

OTHER PUBLICATIONS

Hu, M. et al., "Dot-Product Engine for Neuromorphic Computing: Programming 1T1M Crossbar to Accelerate Matrix-vector Multiplication," Mar. 3, 2016, https://www.labs.hpe.com/techreports/2016/HPE-2016-23.pdf.

*Primary Examiner* — Michael T Tran
(74) *Attorney, Agent, or Firm* — Sheppard Mullin Richter & Hampton LLP

(57) ABSTRACT

Systems are provided for implementing a hybrid resistor-memristor crossbar array, which allows for flexible conductance to be used in implementing the weight matrix of a neural network. The hybrid resistor-memristor crossbar array may include resistor crossbars, each resistor having a static conductance value. The hybrid resistor-memristor crossbar array may also have a memristor coupled to an output line associated with the resistor crossbar array, wherein the memristor has a variable conductance value, and further wherein the static conductance values and the variable conductance value are set to calculate a matrix-vector multiplication associated with a weight matrix of a neural network. An expected range of coefficients for a weight matrix of a neural network can be given by the Discrete Transform Cosine (DCT). Accordingly, the static conductance values of the resistors in the resistors crossbar array are set to values equal to known coefficients of the DCT.

20 Claims, 6 Drawing Sheets

(56) References Cited

U.S. PATENT DOCUMENTS

| | | | | |
|---|---|---|---|---|
| 2011/0317469 | A1* | 12/2011 | Borghetti | H01L 27/101 |
| | | | | 365/148 |
| 2015/0019468 | A1* | 1/2015 | Nugent | G06N 3/063 |
| | | | | 706/25 |
| 2015/0058268 | A1* | 2/2015 | Modha | G06N 3/04 |
| | | | | 706/27 |
| 2016/0203858 | A1* | 7/2016 | Kim | G06N 3/049 |
| | | | | 706/25 |
| 2016/0275395 | A1* | 9/2016 | Amir | G06N 3/105 |
| 2016/0342904 | A1* | 11/2016 | Merkel | G06N 3/0635 |
| 2017/0228345 | A1* | 8/2017 | Gupta | G06N 3/0635 |
| 2017/0291414 | A1* | 10/2017 | Ge | B41J 2/04541 |
| 2018/0253643 | A1* | 9/2018 | Buchanan | H03M 1/1245 |
| 2018/0364785 | A1 | 12/2018 | Hu et al. | |
| 2019/0019538 | A1* | 1/2019 | Li | G11C 7/1006 |
| 2019/0019564 | A1* | 1/2019 | Li | G11C 11/1653 |
| 2019/0026627 | A1* | 1/2019 | Hatcher | G06N 3/0635 |
| 2019/0027217 | A1* | 1/2019 | Strachan | G11C 13/003 |
| 2019/0034788 | A1* | 1/2019 | Burr | G06N 3/063 |
| 2019/0042411 | A1* | 2/2019 | Muralimanohar | G06N 3/08 |
| 2019/0080230 | A1* | 3/2019 | Hatcher | G06F 7/4806 |
| 2019/0237137 | A1 | 8/2019 | Buchanan et al. | |
| 2020/0234114 | A1* | 7/2020 | Rakshit | G06F 17/16 |
| 2020/0356843 | A1* | 11/2020 | Strachan | G06N 3/0445 |
| 2021/0050060 | A1* | 2/2021 | Li | G11C 15/046 |
| 2021/0125667 | A1* | 4/2021 | Sharma | G06N 3/063 |
| 2021/0133541 | A1* | 5/2021 | Vasanthakumaribabu | |
| | | | | G11C 13/0026 |
| 2021/0150317 | A1* | 5/2021 | Hou | G06N 3/08 |
| 2021/0193222 | A1* | 6/2021 | Merced Grafals | |
| | | | | G11C 11/5685 |
| 2021/0201136 | A1* | 7/2021 | Chalamalasetti | G11C 13/0069 |

* cited by examiner

SYSTEM FOR A FLEXIBLE CONDUCTANCE CROSSBAR

DESCRIPTION OF RELATED ART

Memristors are devices that can be programmed to different resistive states by applying a programming energy, such as a voltage. Large crossbar arrays of memory devices with memristors can be used in a variety of applications, including memory, programmable logic, signal processing control systems, pattern recognition, and other applications.

Artificial neural networks are a family of technical models based on biological nervous systems, which are used to estimate or approximate functions that depend on a large number of inputs. Neural networks may be represented as a system of interconnected "neurons" which exchange messages between each other. The connections may have numerical weights that can be tuned based on experience, making neural networks adaptive to inputs and capable of machine learning. Artificial neural networks may have a variety of applications, including function approximation, classification, data processing, robotics, and computer numerical control.

BRIEF DESCRIPTION OF THE DRAWINGS

The present disclosure, in accordance with one or more various embodiments, is described in detail with reference to the following figures. The figures are provided for purposes of illustration only and merely depict typical or example embodiments.

Figure 1:
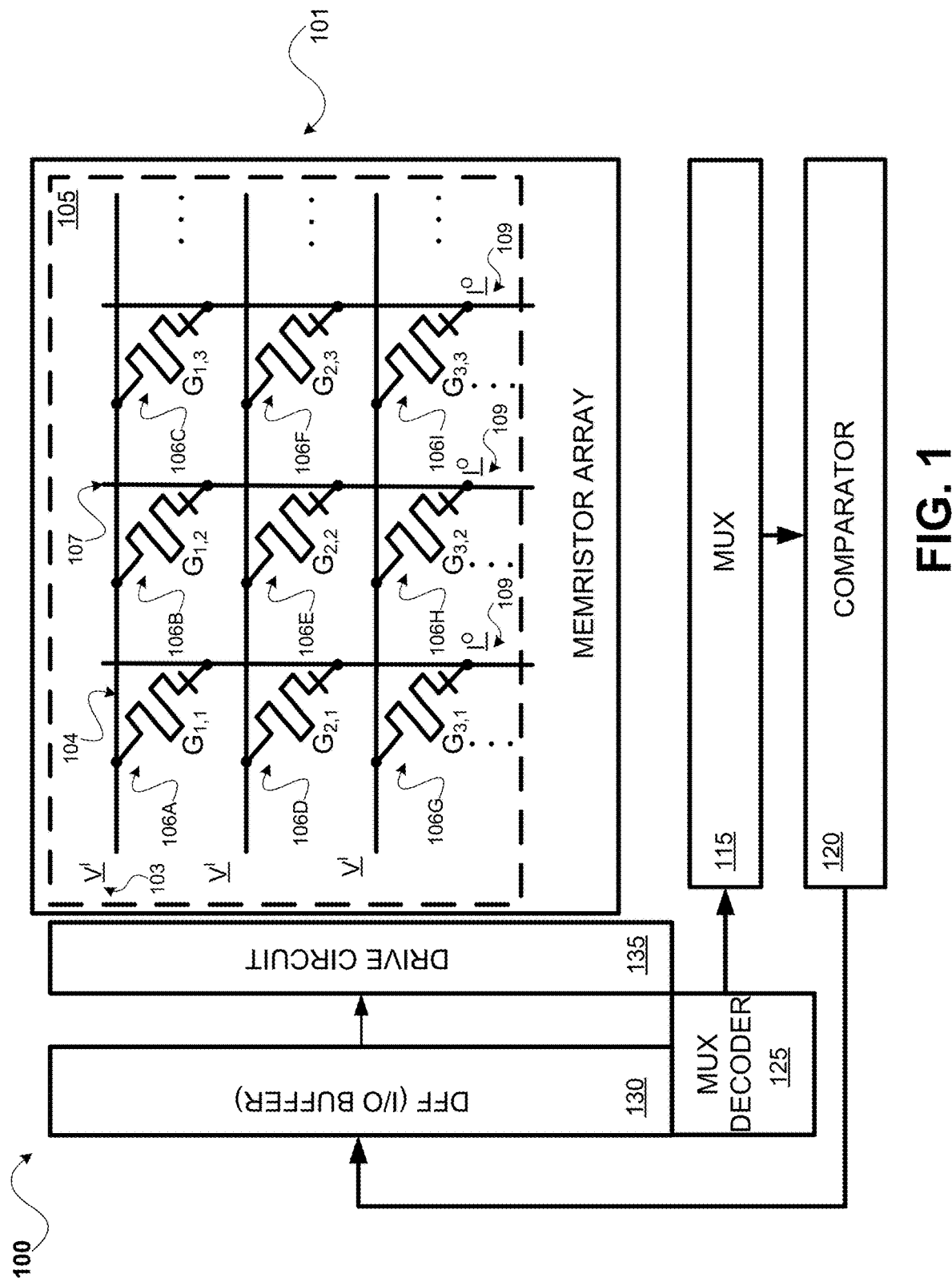
FIG. 1 depicts an example of a hardware accelerator system for calculating node values of a neural network including a crossbar array that uses only memristor-based cells at each node, according to some embodiments.

The figures are not exhaustive and do not limit the present disclosure to the precise form disclosed.

DETAILED DESCRIPTION

Various embodiments described herein are directed to hardware configured to emulate a logical neural network. Furthermore, the hardware has been adapted to include dedicated circuitry, namely a hybrid resistor-memristor crossbar array that is designed considering the tradeoffs between resistors and memristors for optimized performance. As a general description, the hybrid design may include for example: a crossbar array of resistors, where the resistors function as fixed conductance elements; and an array of memristors, where the memristors function as variable conductance elements. The resistor crossbar array can be a network of resistors that are hardware emulations of static coefficients in a transform. The example transform, disclosed herein, but not limited to, an inverse Discrete Cosine Transform (DDC), can approximate variable structures by using a weighted series of fixed patterns. Accordingly, some of the variable aspects of matrix-vector multiplication can be approximated using fixed structures in an inverse DCT. These fixed structures in the inverse DCT correspond to the resistors (e.g., fixed value elements) of the hybrid resistor-memristor crossbar array, while an array of memristors correspond to the weights applied to the fixed structures.

By leveraging static structures, the hybrid resistor-memristor crossbar array is capable of performing multiplication between a vector and a weighted series of matrices analogically. Thus, the disclosed hybrid resistor-memristor crossbar array can be applied to compute a general matrix-vector multiplication with flexible levels of precision and efficiency, while supporting fixed sources of conductance, namely resistors, as a primary component of its crossbars.

Memristors are devices that may be used as components in a wide range of electronic circuits, such as memories, switches, radio frequency circuits, and logic circuits and systems. In a memory structure, a crossbar array of memory devices having memristors may be used. When used as a basis for memory devices, memristors may be used to store bits of information that may represent at least two discrete states, ON or OFF, or 1 or 0. The resistance of a memristor may be changed by applying an electrical stimulus, such as a voltage or a current, through the memristor. Generally, at least one channel may be formed that is capable of being switched between two states-one in which the channel forms an electrically conductive path ("on") and one in which the channel forms a less conductive path ("off"). In some other cases, conductive paths represent "off" and less conductive paths represent "on". Furthermore, memristors may also behave as an analog component with variable conductance, and it is this characteristic (e.g., memristors used analogically) that is applied in the hybrid memristor-resistor crossbar array, as disclosed herein.

In some applications, a memory crossbar array can be used to perform vector-matrix computations. For example, an input voltage signal from each row line of the crossbar is weighted by the conductance of the resistive devices in each column line and accumulated as the current output from each column line. Ideally, if wire resistances can be ignored, the current (I) flowing out of the crossbar array will be approximately represented in the equation below:

$$I^T = V^T G \qquad (1)$$

where V is the input voltage and G is the conductance matrix

The crossbar array is configured to include contributions from each memristor in the crossbar array. The use of memristors at junctions or cross-point of the crossbar array enables programming the resistance (or conductance) at each such junction. In order to avoid unintentional significant alteration of the programmed conductance of a given set of memristors, (that could either damage the cells or change the state they hold, as a side effect of accumulated and repetitive forming, reading or writing operations) a selector circuit may be implemented (shown in FIG. 1) and a mechanism that may restrict which section of the crossbar (as a matrix or a vector, an entire row or a line, or parts of it) is active at a given time for any operation. The necessity and size of such sections and its disposition depends on the specific application, crossbar implementation, usage, nature and composition of memristive cells.

Examples disclosed herein include hardware accelerators for calculating node values for neural networks. However, it should be appreciated that neural networks merely serve as an example of a practical use for the hardware accelerators and hybrid memristor-resistor crossbar array circuitry. For instance, the disclosed hybrid memristor-resistor crossbar array circuitry can by and large perform a much more general operation than neural network operations, namely matrix-vector multiplication.

Example hardware accelerators may include a crossbar array programmed to calculate node values. Memory cells of the crossbar array may be programmed according to a weight matrix. Driving input voltages mapped from an input vector through the crossbar array may produce output current values which may be compared to a threshold current to generate a new input vector of new node values. In this manner, example accelerators herein provide for hardware calculations of node values for neural networks.

Referring now to the drawings, FIG. 1 illustrates an example hardware accelerator 100 according to the embodiments. Hardware accelerator 100 may be a hardware unit that executes an operation that calculates node values for neural networks. Hardware accelerator 100 may calculate new node values of a neural network by transforming an input vector in relation to a weight matrix. Hardware accelerator 100 may do so by calculating a vector-matrix multiplication of the input vector with the weight matrix.

In the example illustrated in FIG. 1, a Hopfield Neural Network (HNN) is implemented by the hardware accelerator 100 described herein. FIG. 1 shows an implementation of the example hardware accelerator 100 having various components, including: memristor crossbar array 101; multiplexer (MUX) 115; comparator 120; MUX decoder 125; delay flip-flop (DFF) (I/O Buffer) 130; and drivers 135. Additionally, in the hardware accelerator 100, crossbar array 101 includes memristor crossbar array 105. Memristor crossbar array 105 can be configured to implement the weight matrix aspects of the HNN, as described above.

Figure 4:
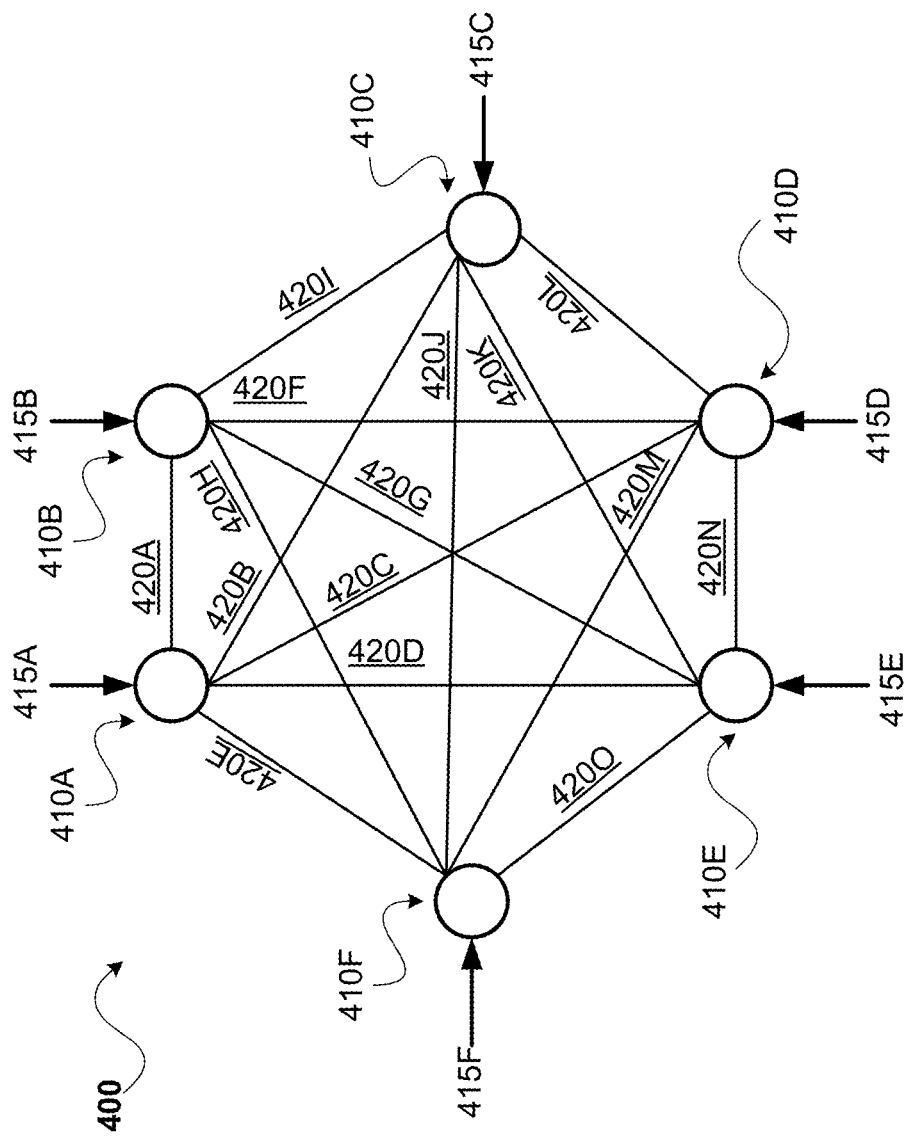
FIG. 4 is conceptual model illustrating an example neural network.

As previously described, HNNs are a type of artificial neural network that can be used as a computational mechanism for various applications. A model of an HNN is conceptually illustrated in FIG. 4. Graphically, an HNN as a mathematical construct can be represented as graph 400 of a bidirectional (undirected) network with nodes ($s_i$) 410A-410F and edges ($w_{ij}$) 420A-420O. Edges 420A-420O can be formed between each of the nodes 410A-410F. A computational "problem" can be encoded (or trained) in the edge weights and a threshold function. Input node values 415A-415F can be delivered to the nodes 410A-410F until the computational "answer" to the problem is determined by a final state for the node values. In this manner, an HNN can be a dynamic system, and the node values can evolve based on the edge weightings to all the other node values (e.g., as a dot product operation). The dynamics follow energy minimizing rules, such that the "energy" of the system does not increase, and thus can find a minimum. The final configuration of the nodes encodes the solution. Therefore the "energy" indicates whether the network is modified when an update occurs, and the system reaches its minimum energy when it becomes stable. The HNN can be "trained" to a set of distinct inputs. As alluded to above, HNNs can employ update rules that minimize a network's energy function (e.g., only reducing energy at each successive update).

Referring back to FIG. 1, hardware accelerator 100 may be implemented as memristor crossbar array 105. Memristor crossbar array 105 can be a configuration of parallel and perpendicular lines with memory cells coupled between lines at intersections. Memristor crossbar array 105 may include a plurality of row lines 104, a plurality of column lines 107, and a plurality of memory cells 106A-106I. Each of the memory cells 106A-106I may be coupled between each unique combination of one row line 104 and one column line 106. In other words, none of the memory cells 106A-106I share both a row line and a column line.

Row lines 104 may be electrodes that carry current through memristor crossbar array 105. In some examples, row lines 104 may be parallel to each other, generally with equal spacing. Row lines 104 may sometimes be, for example, a top electrode or a word line. Similarly, column lines 107 may be electrodes that run nonparallel to row lines 104. Column lines 107 may sometimes be, for example, a bottom electrode or bit line. Row lines 104 and column lines 107 may serve as electrodes that deliver voltage and current to the memory cells 106A-106I. Example materials for row lines 104 and column lines 107 may include conducting materials such as Pt, Ta, Hf, Zr, Al, Co, Ni, Fe, Nb, Mo, W, Cu, Ti, TiN, TaN, $Ta_2N$, $WN_2$, NbN, MoN, $TiSi_2$, TiSi, $TiSi_3$, $TaSi_2$, $WSi_2$, $NbSi_2$, $V_3Si$, electrically doped polycrystalline Si, electrically doped polycrystalline Ge, and combinations thereof. In the example of FIG. 1, crossbar array 105 may have N row lines and M column lines.

Memory cells 106A-106I may be coupled between row lines 104 and column lines 107 at intersections of the row lines 104 and column lines 107. For example, memory cells 106A-106I may be positioned to calculate new node values of an input vector of node values with respect to a weight matrix. Each of the memory cells 106A-106I may have a memory device such as a resistive memory element, a capacitive memory element, or some other form of memory.

In some examples, each of the memory cells 106A-106I may include a resistive memory element. A resistive memory element may have a resistance that changes with an applied voltage or current. Furthermore, in some examples, the resistive memory element may "memorize" its last resistance. In this manner, each resistive memory element may be set to at least two states. In many examples, a resistive memory element may be set to multiple resistance states, which may facilitate various analog operations. The resistive memory element may accomplish these properties by having a memristor, which may be a two-terminal electrical component that provides memristive properties as described herein.

In some examples, a memristor may be nitride-based, meaning that at least a portion of the memristor is formed from a nitride-containing composition. A memristor may also be oxide-based, meaning that at least a portion of the memristor is formed from an oxide-containing material. Furthermore, a memristor may be oxy-nitride based, meaning that at least a portion of the memristor is formed from an oxide-containing material and that at least a portion of the memristor is formed from a nitride-containing material. Example materials of memristors may include tantalum oxide, hafnium oxide, titanium oxide, yttrium oxide, niobium oxide, zirconium oxide, or other like oxides, or non-transition metal oxides, such as aluminum oxide, calcium oxide, magnesium oxide, dysprosium oxide, lanthanum oxide, silicon dioxide, or other like oxides. Further examples include nitrides, such as aluminum nitride, gallium nitride, tantalum nitride, silicon nitride, and oxynitrides such as silicon oxynitride. In addition, other functioning memristors may be employed in the practice of the teachings herein.

A memristor may exhibit nonlinear or linear current-voltage behavior. Nonlinear may describe a function that grows differently than a linear function. In some implementations, a memristor may be linear or nonlinear in voltage ranges of interest. A voltage range of interest may be, for example, a range of voltages used in the operation of hardware accelerator 100. In some examples, memory cells 106A-106I may include other components, such as access transistors or selectors. For example, each of the memory cells 106A-106I may be coupled to an access transistor between the intersections of a row line 104 and a column line 106. Access transistors may facilitate the targeting of individual or groups of memory cells 106A-106I for the purposes of reading or writing the memory cells.

Alternatively, a selector may be an electrical device that may be used in memristor devices to provide desirable electrical properties. For example, a selector may be a 2-terminal device or circuit element that admits a current that depends on the voltage applied across the terminals. A selector (not shown) may be coupled to each of the memory cells 106A-106I to facilitate the targeting of individual or groups of memory cells 106A-106I. For example, a selector may do so by acting like an on-off switch, and it may mitigate sneak current disturbance.

The memory cells 106A-106I of crossbar array 105 may be programmed according to a weight matrix of a neural network. A weight matrix may represent a compilation of operations of a neural network. For example, a weight matrix may represent the weighted edges of HNN illustrated in FIG. 4. The value stored in the memory cells 106A-106I may represent the values of a weight matrix. In implementations of resistive memory, the resistance levels of each of the memory cells 106A-106I may represent a value of the weight matrix. In such a manner, the weight matrix may be mapped onto crossbar array 105.

Memory cells 106A-106I may be programmed, for example, by having programming signals driven through them, which drives a change in the state of the memory cells 106A-106I. The programming signals may define a number of values to be applied to the memory cells 106A-106I. As described herein, the values of memory cells 106A-106I of crossbar array 105 may represent a weight matrix of a neural network, such as an HNN.

In continuing reference to FIG. 1, hardware accelerator 100 may receive an input vector of node values at the plurality of row lines 104. The input vector may include node values which are to be evolved into next input values for the neural network. The input vector node values may be converted to input voltages (V') 103 by a drive circuit 135. A drive circuit 135 may deliver a set of input voltages that represents the input vector to the memristor crossbar array 105. In some examples, the voltages 103 may be other forms of electrical stimulus such as an electrical current driven to the memory cells 106A-106I. Furthermore, in some examples, the input vector may include digital values, which may be converted to analog values of the input electrical signals by a digital-to-analog converter. In other examples, the input vector may already include analog values.

Upon passing through the memristor crossbar array 105, the plurality of column lines 107 may deliver output currents (I°) 109, where the output currents 109 may be compared to a threshold current according to an update rule to generate a new input vector of new node values. Details of these operations is described in below.

Hardware accelerator 100 may also include other peripheral circuitry associated with crossbar array 105. For example, an address decoder, e.g. MUX decoder 125, may be used to select a row line of row lines 104, and activate the drive circuit 135 corresponding to the selected row line 104. The drive circuit 135, for a selected row line 104, can drive a corresponding row line 104 with different voltages corresponding to a neural network or the process of setting resistance values within memory cells 106A-106I of crossbar array 105. Similar drive and decode circuitry may be included for column lines 107. Control circuitry may also be used to control application of voltages at the inputs and reading of voltages at the outputs of hardware accelerator 100. Digital to analog circuitry and analog to digital circuitry may be used for input voltages 103 and the output currents 109. In some examples, the peripheral circuitry above described can be fabricated using semiconductor processing techniques in the same integrated structure or semiconductor die as crossbar array.

Example operations of hardware accelerator 100 are described herein. A first operation may program the memory cells 106A-106I in the memristor crossbar array 105 so as to map the mathematic values in an N×M (wherein M corresponds to the number of rows and N corresponds to the number of columns) weight matrix to the array. In some examples, N and M may be the same number, and the weight matrix is symmetrical. In some examples, each of the memory cells 106A-106I are programmed at a time during the programming operation. A second operation may calculate an output current by the dot-product of input voltage and the resistance values of the memory cells of a column line 107. In this operation, input voltages are applied, and output currents may be obtained, the output currents corresponding to the result of multiplying an N×M matrix by an N×1 vector. In some examples, the input voltages may be below the programming voltages. Therefore, the resistance values of the memory cells 106A-106I, such as resistive memory, ideally are not changed during the linear transformation calculation. The third operation is to compare the output currents with a threshold current. For example, comparators 120 may compare the output currents with the threshold current to determine a new input vector of new node values.

In an example, hardware accelerator 100 may calculate node values by applying a set of voltages (V') 103 simultaneously along row lines 104 of the N×M crossbar array 105 and collecting the currents through column lines 107 and generating new node values. On each column line 107, every input voltage 103 is weighted by the corresponding memristance ($1/G_{ij}$) and the weighted summation is reflected at the output current. Using Ohm's law, the relation between the input voltages 103 and the output currents can be represented by a vector-matrix multiplication of the form: $\{V^O\}T = -\{V^I\}^T[G]$ Rs, where $G_{ij}$ is an N×M matrix determined by the conductance (inverse of resistance) of memristor crossbar array 105, Rs is the resistance value of sense amplifiers (not shown) and T denotes the transpose of the column vectors $V^O$ and $V^I$. The negative sign follows from use of a negative feedback operational amplifier in the sense amplifiers that are used to output a voltage proportional to the current flowing in the column line 107. From the foregoing, it follows that the hardware accelerator 100 can be utilized for multiplying a first vector of values $\{b_i\}^T$ by a matrix of values $[a_{ij}]$ to obtain a second vector of values $\{c_j\}^T$, where i=1,N and j=1,M. The vector operation can be set forth in more detail as follows:

$$a_{11}b_1 + a_{21}b_2 + \ldots + a_{N1}b_N = c_1 \quad (3)$$

$$a_{1M}b_1 + a_2b_2 + \ldots + a_{NM}b_N = c_M$$

The vector processing or multiplication using the principles described herein generally starts by mapping a matrix of values [$a_{ij}$] onto crossbar array 105 or, stated otherwise, programming (e.g., writing) conductance values $G_{ij}$ into the crossbar junctions of the crossbar array 105.

With reference still to FIG. 1, in some examples, each of the conductance values $G_{ij}$ may be set by sequentially imposing a voltage drop over each of the memory cells 106A-106I. For example, the conductance value $G_{2,3}$ may be set by applying a voltage equal to $V_{Row2}$ at the second row line 104 of memristor crossbar array 105 and a voltage equal to $V_{Col3}$ at the third column line 107 of the array 105. The voltage input, $V_{Row2}$, may be applied to the second row line occurring at the second row line adjacent the j=1 column line. The voltage input, $V_{Col3}$, will be applied to the third column line adjacent either the i=1 or i=N location. Note that when applying a voltage at a column line 107, the sense circuitry for that column line may be switched out and a voltage driver switched in. The voltage difference $V_{Row2} - V_{Col3}$ will generally determine the resulting conductance value $G_{2,3}$ based on the characteristics of the memory cell 106f located at the intersection. When following this approach, the unselected column lines 107 and row lines 104 may be addressed according to one of several schemes, including, for example, floating all unselected column lines 107 and row lines 104 or grounding all unselected column lines and row lines. Other schemes may involve grounding column lines 107 or grounding partial column lines 107. Grounding unselected column lines and row lines may help isolate the unselected column lines and row lines to minimize the sneak path currents to the selected column line 107.

In accordance with examples herein, memristors used in memory cells 106A-106I may have linear current-voltage relations. Linear current-voltage relations permit higher accuracy in the matrix multiplication process. However, memristor crossbar array 105 having linear memristors may be prone to large sneak path currents during programming of the array 105, particularly when the size of memristor crossbar array 105 is larger than a certain size, for instance, 32×32. In such cases, the current running through a selected memristor may not be sufficient to program the memristor because most of the current runs through the sneak paths. Alternatively, the memristor may be programmed at an inaccurate value because of the sneak paths.

To alleviate the sneak path currents in such instances, and especially when larger arrays are desired, an access device, such as an access transistor or a non-linear selector, may be incorporated within or utilized together with a memristor to minimize the sneak path currents in the array. More specifically, memory cell should be broadly interpreted to include memristive devices including, for example, a resistive memory element, a memristor, a memristor and transistor, or a memristor and other components.

Following programming, operation of hardware accelerator 100 proceeds by applying the input voltages 110 and comparing the output currents to threshold currents. The output current delivered from column lines 107 may be compared, by current comparator 120, with a threshold current. Current comparator 120 may be a circuit or device that compares two currents (i.e., output current and threshold current) and outputs a digital signal indicating which is larger. Current comparator 120 may have two analog input terminals and one binary digital output. The comparator 120 may determine a new node value for the emulated HNN. The new node values may be aggregated to generate a new input vector. For example, each output current may be compared by an update rule. A new node value corresponding to a particular output current can be set to a first value if the particular output current is greater than or equal to the threshold current, $\theta_i$. The new node value can be set to a second value if the particular output current is less than the threshold current. Each output current may be represented as the sum of the products of an input vector with the weight matrix.

The node values may also be programmed to attain values of +1 or 0, rather than +1 and −1 in the above equation. Any other pair of values may also be used. In some examples, the threshold currents may be delivered to the current comparators 120 via circuitry independent from crossbar array 102. Furthermore, in some examples, column lines 107 may have different threshold currents associated with it. This is further described below. Alternatively, each column line 106 may be associated with a same threshold current.

Upon delivery of the new input vector of new node values, a controller may determine whether the new node values are final node values of the HNN. A neural network, for example, may be modeled to determine a minimum energy of a system. In such an example, a controller can determine whether the new node values, which here represent an energy of the system, are a local minimum of the system. In response to a controller determining that the new node values are not final node values, the new input vector can be converted to input voltages to be delivered to the plurality of row lines of the crossbar array 105. In such a manner, the hardware accelerator 100 can be recurrent to calculate an iterative problem, such as determining a minimum energy of a system, implementing an HNN as hardware.

In some cases, the hardware accelerator 100 can be implemented as an engine in a computing device. Example computing devices that include an example accelerator may be, for example, a personal computer, a cloud server, a local area network server, a web server, a mainframe, a mobile computing device, a notebook or desktop computer, a smart TV, a point-of-sale device, a wearable device, any other suitable electronic device, or a combination of devices, such as ones connected by a cloud or internet network, that perform the functions described herein.

Figure 2A:
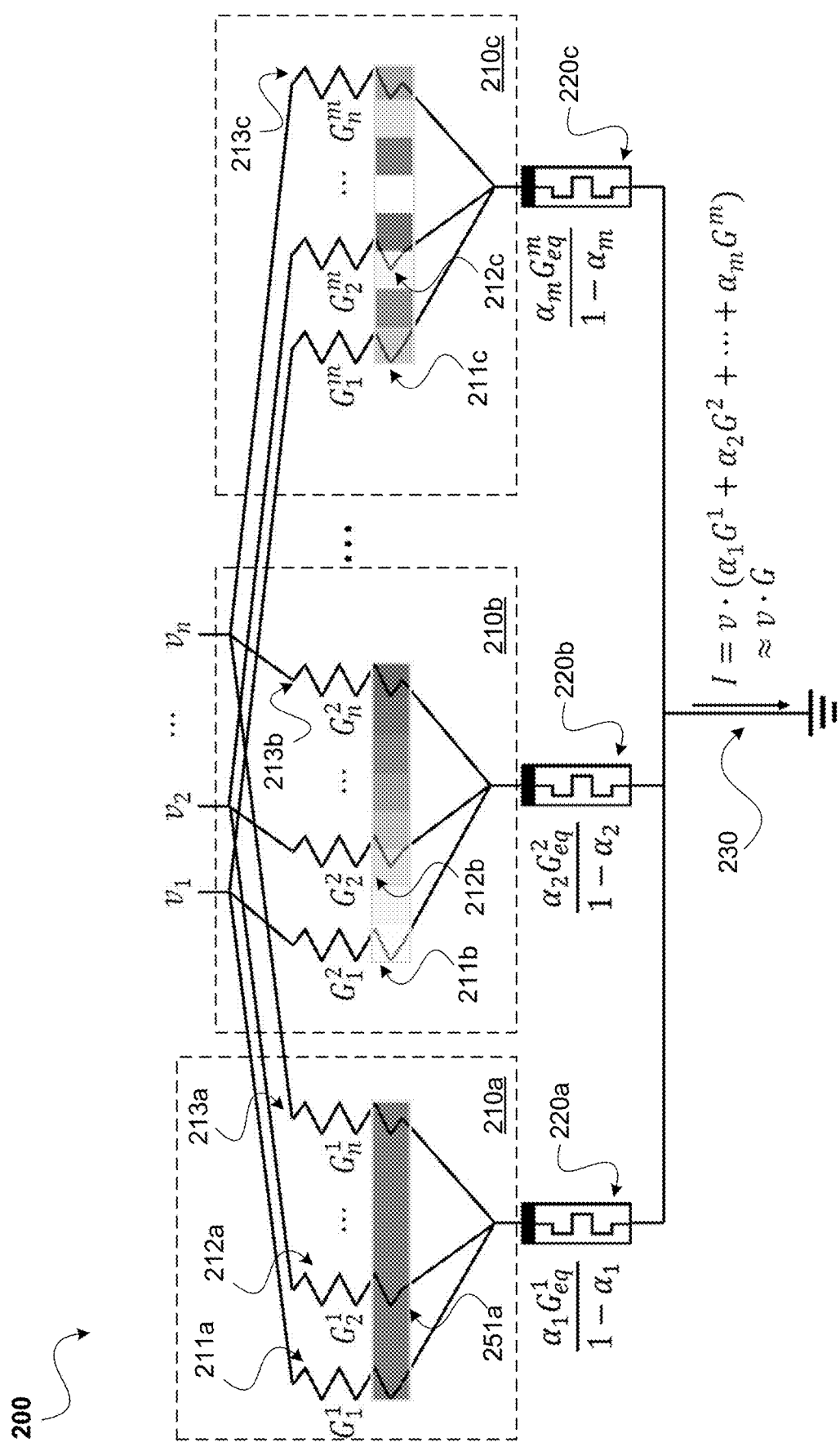
FIG. 2A illustrates an example of a circuit configuration implementing the hybrid memristor-resistor solution, for implementing a weight matrix of a neural network, according to some embodiments.

FIG. 2A shows a conceptual diagram illustrating a hybrid resistor-memristor crossbar array 200, which allows for flexible conductance to be used in implementing the weight matrix of a neural network. Memristor crossbars, such as the circuitry shown in FIG. 1, are capable of performing analog matrix-vector multiplications very efficiently. As described above, the function of memristor crossbars involves loading adequate conductances onto the programmable memristors. Memristor crossbars are characteristically general, meaning that the design allows for multiplication of different matrices with generality (or without knowledge of the matrix prior to the application). Since generality of the memristor crossbars typically comes from the programmable sources of conductance, the hardware design may be dependent upon using programmable conductances, namely memristors, for each position of the matrix (allowing the function to be variable across uses). Having a memristor in each position can lead to a significant number of memristors in the hardware implementation, as the size and complexity of the matrix (and the crossbars) increases in scale. As a result, designs including a large number of memristors may increase the overall costs associated with the hardware. Furthermore, loading the desired conductance values into the memristors may be slower than is desired. To minimize latency, an entire crossbar circuit may be dedicated to each of the matrices used in the application. To address these drawbacks associated with a full memristor implementation, the hybrid resistor-memristor crossbar array 200 leverages variable approximation using fixed structures. By approximating variable structures, the hybrid design can use fixed conductance elements, namely resistors, and still accomplish vector-matrix multiplication in the same manner as the full memristor crossbar implementation. In other words, resistors (e.g., fixed conductance elements) in the hybrid resistor-memristor crossbar array 200 approximate for memristors (e.g., variable conductance elements) that would otherwise be used in the full memristor crossbar design, which ultimately reduces the number of memristors needed in crossbar array 200.

Also, the hybrid resistor-memristor crossbar array 200 may be more application-specific, rather than having the generality associated with full memristor crossbar hardware. That is, instead of programming each position in the matrix via the respective programable memristor, each position of the resistor crossbar in the hybrid design can be fixed (as opposed to variable) based on having some knowledge of the specific application for the hardware. For instance, the hybrid resistor-memristor crossbar array 200 can be configured to specifically perform a dot (inner) product between two vectors. Generally, the fixed conductance values of the resistors in the hybrid resistor-memristor crossbar array 200 are dependent on the application. Then, the influence of these fixed elements (resistors) on the hardware's output is the variable aspect that is programmed into the few memristors of the hybrid resistor-memristor crossbar array 200. Consequently, the hybrid resistor-memristor crossbar array 200 realizes the advantages associated with a minimal, or reduced, number of memristors in its hardware. Hybrid resistor-memristor crossbar array may be simplified (e.g., number of elements reduced) and/or optimized for an intended application. If the design proves that a basis and/or factor in the transform is approximately negligible (e.g., near zero), then a resistor crossbar that corresponds to that factor may be removed from the design prior to deploying the hardware. It should be appreciated that if a resistor crossbar can be removed without a substantive loss of information (e.g., reasonable quantization), then the hardware implementing hybrid resistor-memristor crossbar array 202 may be simplified by eliminating that crossbar and using less components.

Figure 2B:
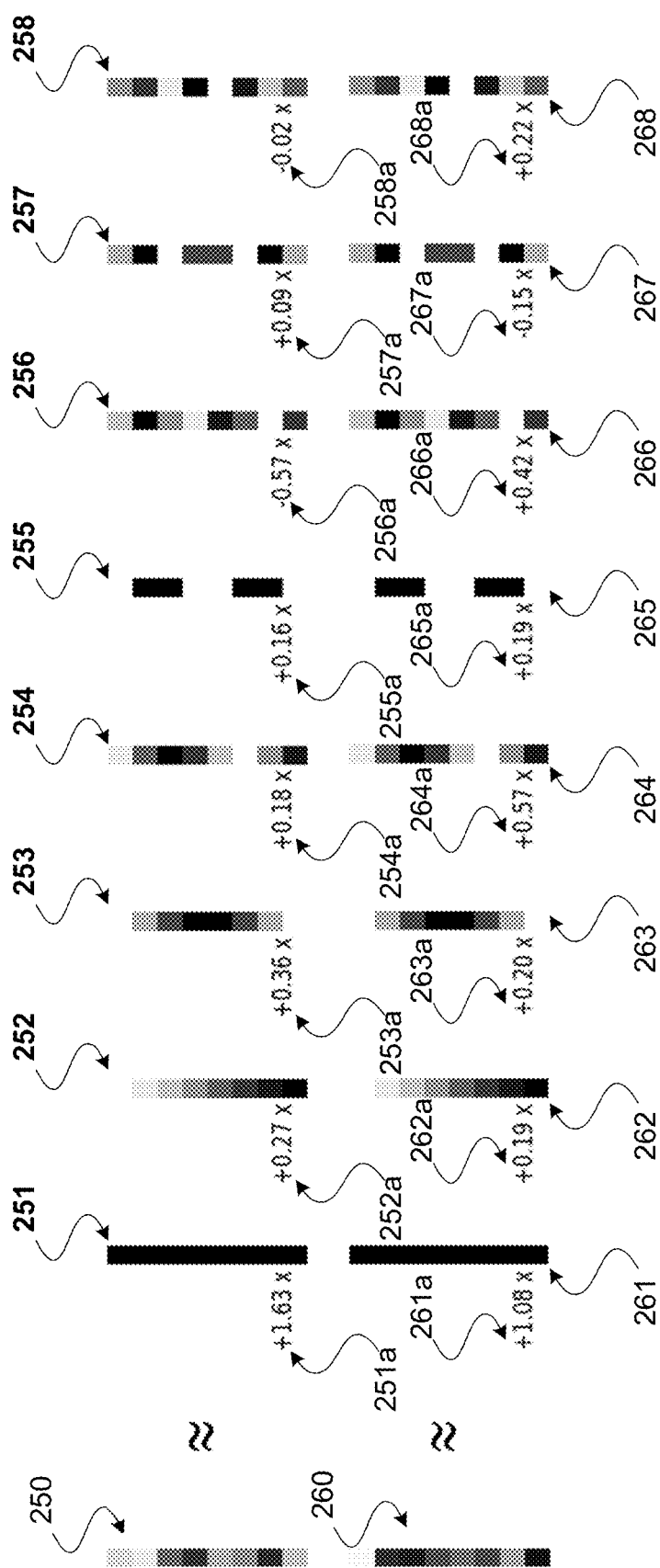
FIG. 2B illustrates a conceptual diagram of an approximation using a discrete cosine transformation (DCT) used to compute resistance of FIG. 2A, according to some embodiments.

For background, Fourier's theorem involves the approximation of variable structures by use of a weighted series of fixed patterns. For instance, any generic vector can be approximated by a series of fixed patterns. This approximation is illustrated in FIG. 2B. As a consequence of Fourier's theorem, random arrays 250 and 260 can be approximated as a weighted sum of the fixed arrays 251-258 and 261-268, respectively. The fixed arrays 251-258 and 261-268 can be referred to as a basis of a Fourier Transform. In the illustrated example, the dimensions of the array are 8×1, but other dimensions (not shown) are also possible. As shown, each of the fixed arrays 251-258 and 261-268 may be associated with factors 251a-258a and 261a-268a, respectively. Each of the fixed arrays 251-258 and 261-268 are multiplied by the corresponding factor 251a-258a and 261a-268a. Thus, the factors 251a-258a and 261a-268a serve as weights used in order to derive the necessary values (which are summed) to appropriately approximate the random arrays 250 and 260. In FIG. 2B, fixed array 251 has a factor 251a that is set to "+1.63." The basis of the transform is fixed, only the factors change. This concept enables variable aspects of vector-matrix multiplication to be approximated using fixed elements by merely changing the weights (e.g., basis remains fixed). As alluded to above, the embodiments are described with respect to a particular Fourier Transform, namely the DCT. However, this embodiment is not intended to be limiting, and various decompositions (other than DCT) may be used to implement the disclosed hybrid resistor-memristor crossbar array 200, as deemed appropriate.

Now referring back to FIG. 2A, conceptually the hybrid resistor-memristor crossbar array 200 includes an array of resistor crossbars 210a, 210b, and 210c that are coupled in series with an array of memristors 220a, 220b, 220c. Resistors 211a-213a, 211b-213b, and 211c-213c comprise each of the resistor crossbars 210a, 210b, and 210c respectively. The resistors 211a-213a, 211b-213b, and 211c-213c function as fixed conductance elements. These fixed conductance elements have a contribution to the total current that is weighted by the memristors 220a, 220b, 220c. As previously described, the memristors 220a, 220b, 220c operate as variable conductance elements. FIG. 2A depicts that each of the resistors 211a-213a, 211b-213b, and 211c-213c (in a respective crossbar 210a, 210b, and 210c) have a corresponding fixed conductance. For example, in resistor crossbar 210a: resistor 211a has a fixed conductance value of $G^1_1$; resistor 212a has a fixed conductance value $G^1_2$; and resistor 213a has a fixed conductance value $G^1_n$. In resistor crossbar 210b: resistor 211b has a fixed conductance value of $G^2_1$; resistor 212b has a fixed conductance value $G^2_2$; and resistor 213b has a fixed conductance value $G^2_n$. In resistor crossbar 210c: resistor 211c has a fixed conductance value of $G^3_1$; resistor 212c has a fixed conductance value $G^3_2$; and resistor 213c has a fixed conductance value $G^3_n$. Furthermore, FIG. 2A illustrates that each resistor crossbar 210a, 210b, and 210c can represent a corresponding fixed array comprising the basis of the DCT relative to the given dimension (n×1) (shown in FIG. 2B). The output signal from the resistor crossbar 210a is fed into memristor 220a. Similarly, the output signal from the resistor crossbar 210b is fed into memristor 220b, and the output signal from the resistor crossbar 210c is fed into memristor 220c. In an example implementation, the memristors 220a, 220b, and 220c may have a programmed value that is represented mathematically below:

$$\frac{\alpha_m G^m_{eq}}{1-\alpha_m} \quad (4)$$

where $\alpha$ is the variable conductance,
G is the fixed conductance,
$m^{th}$ resistor crossbar array,
eq is sum of resistors in $m^{th}$ resistor crossbar array The output from each of the memristors 220a, 220b, 220c may be collectively summed to generate a current value that represents the weighted matrix calculation using the inverse DCT approximation. The resulting current (I) has a value that is represented mathematically below:

$$I = v \cdot (\alpha_1 G^1 + \alpha_2 G_+^2 \ldots \alpha_m G^m) \quad (5)$$

where $\alpha$ is the variable conductance,
G is the fixed conductance,
$m^{th}$ resistor crossbar array,
v is voltage,
I is current By leveraging DCT to approximate the variable structures with resistors (fixed conductance elements), a hardware implementation of the hybrid resistor-memristor crossbar array 200 may result in a substantial reduction (e.g., 95%-97%) of memristor count having a similar processing performance.

Figure 3:
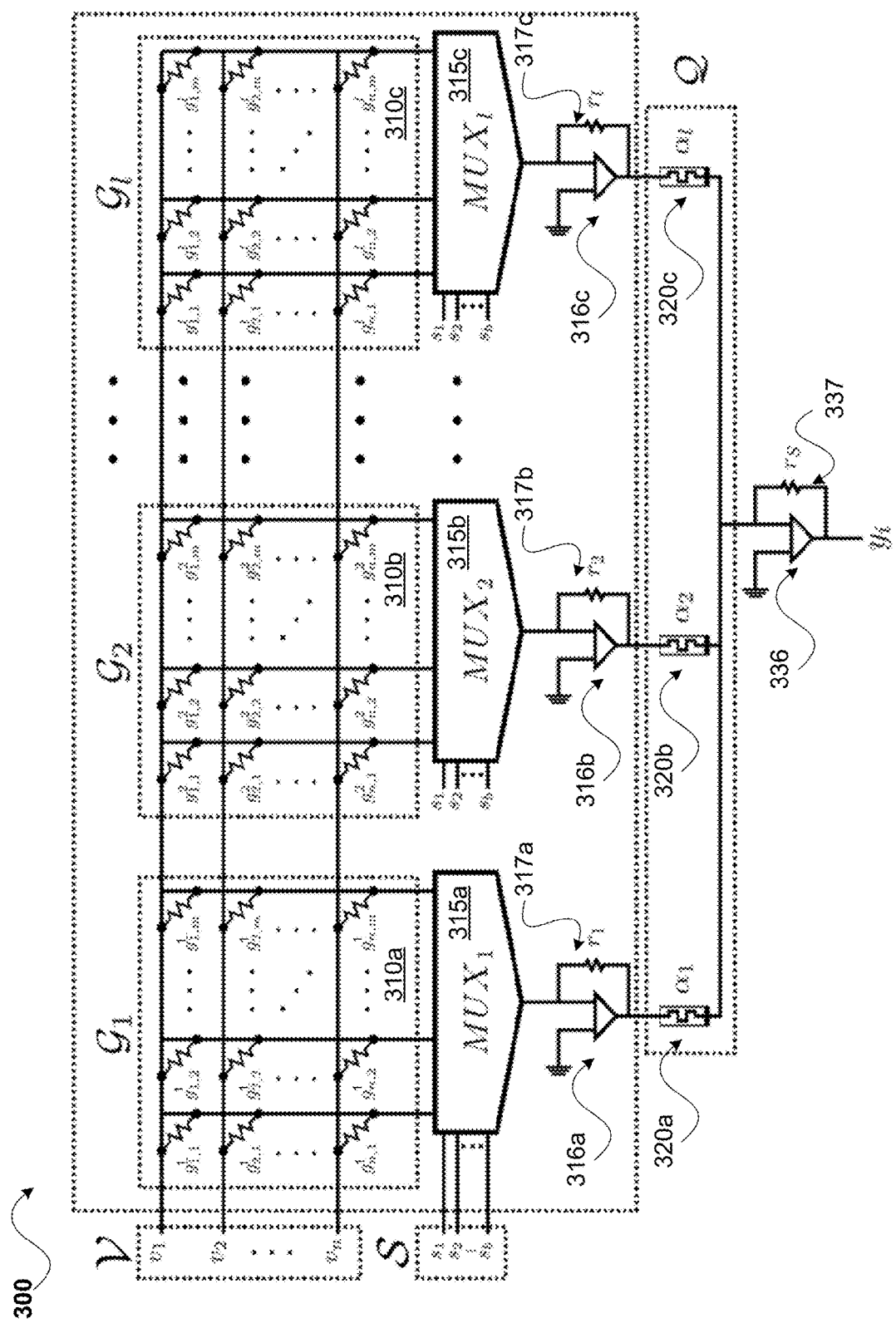
FIG. 3 illustrates a conceptual diagram of a hybrid memristor-resistor crossbar array for implementing a programmable matrix-vector multiplier (e.g., between a matrix and a vector), according to some embodiments.

Referring now to FIG. 3, an example of a configuration of a circuitry 300 is illustrated for implementing the hybrid resistor-memristor crossbar array. The circuitry 300 in FIG. 3 can be described as a more generalized implementation of the circuitry depicted shown in FIG. 2A, performing a multiplication between a hole matrix and a vector (as any vector can be seen as an n by 1 matrix). In other words, the circuitry in FIG. 2A can be considered a specific application (e.g., dot product vector multiplication) of the more generalized function implemented by the circuitry 300 in FIG. 3 (e.g., matrix-vector multiplication). Additionally, the circuitry 300 can be included in the implementation of a hardware accelerator as described above. Generally, the circuit 300 includes: multiple resistor crossbar arrays 310a, 310b, and 310c; multiplexers 315a, 315b, 315c that respectively corresponds to each memristor crossbar array 310a, 310b, and 310c; and memristors 320a, 320b, and 320c that respectively corresponds to each multiplexer 315a, 315b, and 315c. For a given i, each of the resistor crossbar arrays 310a, 310b, and 310c functions as a conventional crossbar with $v_1$; $v_2$; and $v_n$ as voltage inputs representing a vector. Each of the resistors within the resistor crossbar arrays 310a, 310b, and 310n holds a conductance with value $g_i$. Accordingly, by Ohm's Law, the resistor with conductance $g_i$ contributes a current. These currents from the resistor crossbar arrays 310a, 310b, and 310c are added together resulting in a summed current. In this way, each input wire of each multiplexer 315a, 315b, 315c coordinates the output of the operation of a transposed matrix of $G_1$.

The signal input of the multiplexers 315a, 315b, 315c are iteratively set, selecting each of the inputs as the output. Suppose the current signal selects the j-th input as output. In this fashion, the output of the i-th multiplexer is the aforementioned current. This current is converted into a voltage by the respective resistors 317a, 317b, and 317c and transimpedance amplifiers 316a, 316b, and 316c.

The multiplexers 315a-315c seen in FIG. 3 work as single channel selectors, N:1, and can be comprised of analog switches with low insertion loss (ideally zero) DC-capable, to permit the selection of one input to the output at a given time (addressed by S). The multiplexers 315a-315c operate synchronously, in parallel, so that all will be selecting the same relative input channel (position 1, 2, and so on) at a given time. In this example, the multiplexers 315a-315c may allow memristors 320a, 320b, and 320c to influence the current that comes from columns of the matrix they are connected to, one column at a time, so that each memristor influences the current of the entire matrix over time, sequentially column by column as follows:

i) The FIRST column of $G^1$ weighted by memristor 320a, FIRST column of $G^2$ weighted by memristor 320b, and so on, are summed to form the FIRST element of vector y.

ii) The SECOND column of $G^1$ weighted by memristor 320a, SECOND column of $G^2$ weighted by memristor 320b and so on, are summed to form the SECOND element of vector y. This procedure continues until the last m-th step.

For example, the time to process one pass (a single column) of calculations is primarily determined by the operational characteristics of the specific memristive cell in use (e.g., read operation cycle). Accordingly, the hybrid resistor-memristor crossbar array can perform calculations of the entire matrix over time, in the order of nanoseconds to microseconds. In this case of slower memristors (or slower multiplexing), this time can be in the range of milliseconds. In continuous processing applications, the amount of time for processing the matrix can span hours for the hybrid resistor-memristor cross bar array. The memristors 320a, 320b, and 320c can have respective conductance values. The currents induced by each of the memristors 320a, 320b, and 320c can be combined resulting in a current of I amperes going upwards in the respective wire. This current is converted into a voltage of by the resistor 337 and transimpedance amplifier 336. This voltage is shown as the output $y_j$. Since the circuit 300 is designed for computations within a specific context (not necessarily neural networks) one could use statistics on a representative set of metrics to infer the expected coefficients of the DCT. The expected range of each coefficient can be given by the vector that is approximated by the DCT. This translates to the hardware design of the circuit 300, as the static resistances of the resistor crossbar arrays 310a, 310b, and 310c are set to values equal to known coefficients of the DCT. These static resistances of the resistor crossbar arrays 310a, 310b, 310c also yield static conductances that are associated with the resistors (as conductance is the reciprocal of resistance). As referred to herein, static conductance values of the resistor crossbar arrays 310a, 310b, 310c remain consistent (or static) with their initially set values, not changing variably during operation or being dynamically re-programmed. Further, since conductances corresponding to the memristors 320a, 320b, and 320c can be programmed. As referred to herein, variable conductance values of the memristors 320a, 320b, and 320c can change (or variable) from their initially set values, being dynamically re-programmed in operation. The circuit 300 uses a hybrid of resistors and memristors to perform the computation of the multiplication between a vector and a weighted series of matrices. In some implementations, fixed and variable resistors (or their equivalents) can be used as static conductance and memristive components, respectively. Furthermore, in some implementations, memristors with mostly static conductance values that could also be programed for a specific application (thus providing greater flexibility for optimizations on accuracy and repeatability) may be used in place of the resistor elements.

Consequently, the circuitry 300 implementing the hybrid resistor-memristor crossbar array can achieve similar functionality to the "all memristor" implementation shown in FIG. 1, by employing resistors crossbars 310a, 310b, and 310c. This hybrid design shown in FIG. 3 considers the tradeoff between using static resistors, which are generally more stable, precise, and smaller elements (as compared to memristors), and the programmability and flexibility of memristors. As a result, the hybrid resistor-memristor crossbar array implemented in the circuitry 300 may be optimized, providing hardware circuitry that is overall smaller, faster, and less expensive.

Figure 5:
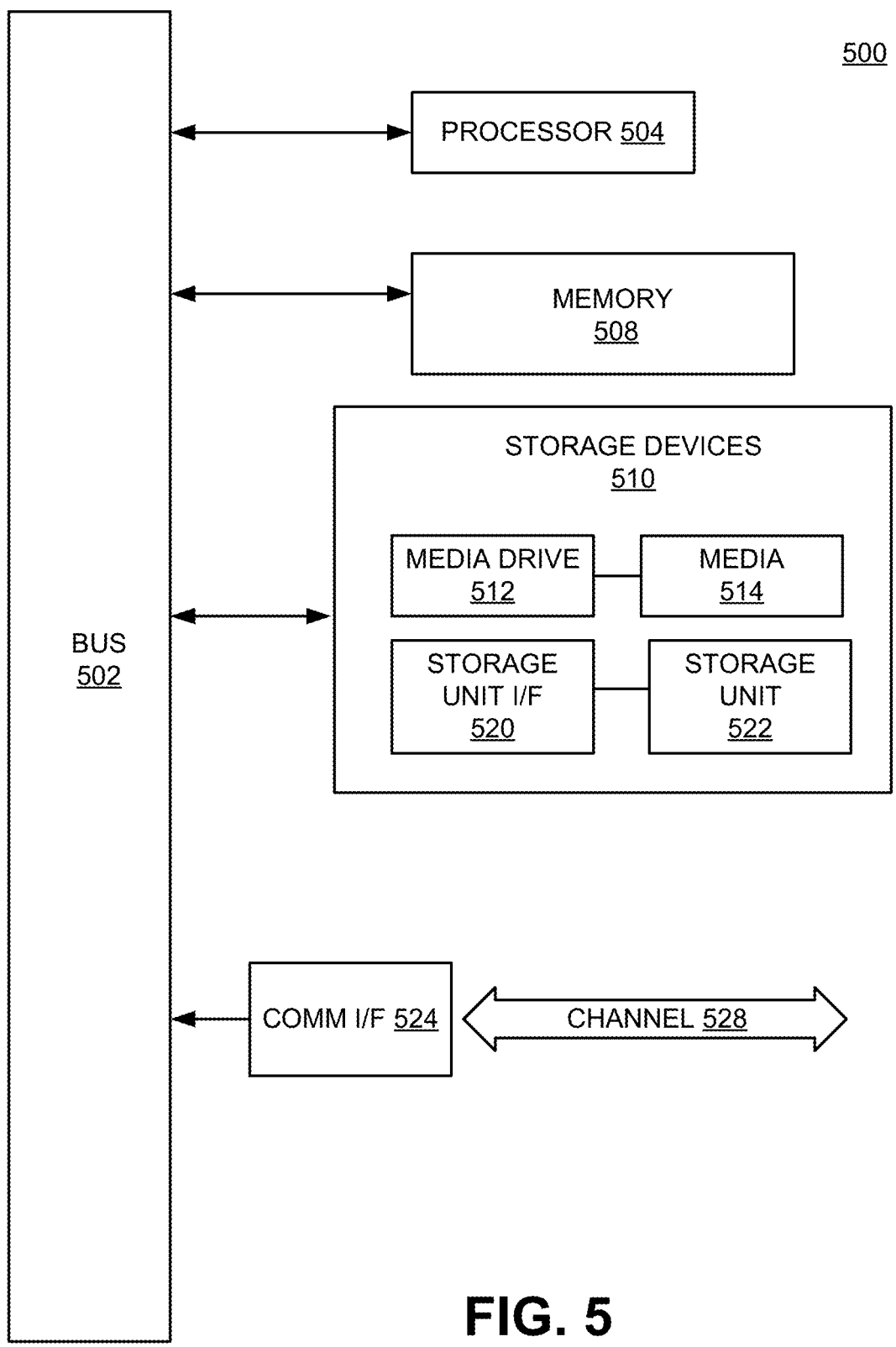
FIG. 5 illustrates an example computer system that may include the hardware accelerator emulating a neural network shown in FIG. 1, according to some embodiments.

FIG. 5 depicts a block diagram of an example computer system 500 in which the hybrid resistor-memristor crossbar array of the embodiments described herein may be implemented. The computer system 500 includes a bus 502 or other communication mechanism for communicating information, one or more hardware processors 504 coupled with bus 502 for processing information. Hardware processor(s) 504 may be, for example, one or more general purpose microprocessors.

The computer system 500 also includes a main memory 508, such as a random-access memory (RAM), cache and/or other dynamic storage devices, coupled to bus 502 for storing information and instructions to be executed by processor 504. Main memory 508 also may be used for storing temporary variables or other intermediate information during execution of instructions to be executed by processor 504. Such instructions, when stored in storage media accessible to processor 504, render computer system 500 into a special-purpose machine that is customized to perform the operations specified in the instructions.

The computer system 500 further includes storage devices 510 such as a read only memory (ROM) or other static storage device coupled to bus 502 for storing static information and instructions for processor 504. A storage device 510, such as a magnetic disk, optical disk, or USB thumb drive (Flash drive), etc., is provided and coupled to bus 502 for storing information and instructions.

The computer system 500 may be coupled via bus 502 to a display 512, such as a liquid crystal display (LCD) (or touch screen), for displaying information to a computer user. An input device 514, including alphanumeric and other keys, is coupled to bus 502 for communicating information and command selections to processor 504. Another type of user input device is cursor control 516, such as a mouse, a trackball, or cursor direction keys for communicating direction information and command selections to processor 504 and for controlling cursor movement on display 512. In some embodiments, the same direction information and command selections as cursor control may be implemented via receiving touches on a touch screen without a cursor.

The computing system 500 may include a user interface module to implement a GUI that may be stored in a mass storage device as executable software codes that are executed by the computing device(s). This and other modules may include, by way of example, components, such as software components, object-oriented software components, class components and task components, processes, functions, attributes, procedures, subroutines, segments of program code, drivers, firmware, microcode, circuitry, data, databases, data structures, tables, arrays, and variables.

In general, the word "component," "engine," "system," "database," data store," and the like, as used herein, can refer to logic embodied in hardware or firmware, or to a collection of software instructions, possibly having entry and exit points, written in a programming language, such as, for example, Java, C or C++. A software component may be compiled and linked into an executable program, installed in a dynamic link library, or may be written in an interpreted programming language such as, for example, BASIC, Perl, or Python. It will be appreciated that software components may be callable from other components or from themselves, and/or may be invoked in response to detected events or interrupts. Software components configured for execution on computing devices may be provided on a computer readable medium, such as a compact disc, digital video disc, flash drive, magnetic disc, or any other tangible medium, or as a digital download (and may be originally stored in a compressed or installable format that requires installation, decompression or decryption prior to execution). Such software code may be stored, partially or fully, on a memory device of the executing computing device, for execution by the computing device. Software instructions may be embedded in firmware, such as an EPROM. It will be further appreciated that hardware components may be comprised of connected logic units, such as gates and flip-flops, and/or may be comprised of programmable units, such as programmable gate arrays or processors.

The computer system 500 may implement the techniques described herein using customized hard-wired logic, one or more ASICs or FPGAs, firmware and/or program logic which in combination with the computer system causes or programs computer system 500 to be a special-purpose machine. According to one embodiment, the techniques herein are performed by computer system 500 in response to processor(s) 504 executing one or more sequences of one or more instructions contained in main memory 508. Such instructions may be read into main memory 508 from another storage medium, such as storage device 510. Execution of the sequences of instructions contained in main memory 508 causes processor(s) 504 to perform the process steps described herein. In alternative embodiments, hard-wired circuitry may be used in place of or in combination with software instructions.

The term "non-transitory media," and similar terms, as used herein refers to any media that store data and/or instructions that cause a machine to operate in a specific fashion. Such non-transitory media may comprise non-volatile media and/or volatile media. Non-volatile media includes, for example, optical or magnetic disks, such as storage device 510. Volatile media includes dynamic memory, such as main memory 508. Common forms of non-transitory media include, for example, a floppy disk, a flexible disk, hard disk, solid state drive, magnetic tape, or any other magnetic data storage medium, a CD-ROM, any other optical data storage medium, any physical medium with patterns of holes, a RAM, a PROM, and EPROM, a FLASH-EPROM, NVRAM, any other memory chip or cartridge, and networked versions of the same.

Non-transitory media is distinct from but may be used in conjunction with transmission media. Transmission media participates in transferring information between non-transitory media. For example, transmission media includes coaxial cables, copper wire and fiber optics, including the wires that comprise bus 502. Transmission media can also take the form of acoustic or light waves, such as those generated during radio-wave and infra-red data communications.

The computer system 500 also includes a communication interface 518 coupled to bus 502. Network interface 518 provides a two-way data communication coupling to one or more network links that are connected to one or more local networks. For example, communication interface 518 may be an integrated service digital network (ISDN) card, cable modem, satellite modem, or a modem to provide a data communication connection to a corresponding type of telephone line. As another example, network interface 518 may be a local area network (LAN) card to provide a data communication connection to a compatible LAN (or WAN component to communicated with a WAN). Wireless links may also be implemented. In any such implementation, network interface 518 sends and receives electrical, electromagnetic or optical signals that carry digital data streams representing various types of information.

A network link typically provides data communication through one or more networks to other data devices. For example, a network link may provide a connection through local network to a host computer or to data equipment operated by an Internet Service Provider (ISP). The ISP in turn provides data communication services through the world-wide packet data communication network now commonly referred to as the "Internet." Local network and Internet both use electrical, electromagnetic or optical signals that carry digital data streams. The signals through the various networks and the signals on network link and through communication interface 518, which carry the digital data to and from computer system 500, are example forms of transmission media.

The computer system 500 can send messages and receive data, including program code, through the network(s), network link and communication interface 518. In the Internet example, a server might transmit a requested code for an application program through the Internet, the ISP, the local network and the communication interface 518.

The received code may be executed by processor 504 as it is received, and/or stored in storage device 510, or other non-volatile storage for later execution.

Each of the processes, methods, and algorithms described in the preceding sections may be embodied in, and fully or partially automated by, code components executed by one or more computer systems or computer processors comprising computer hardware. The one or more computer systems or computer processors may also operate to support performance of the relevant operations in a "cloud computing" environment or as a "software as a service" (SaaS). The processes and algorithms may be implemented partially or wholly in application-specific circuitry. The various features and processes described above may be used independently of one another or may be combined in various ways. Different combinations and sub-combinations are intended to fall within the scope of this disclosure, and certain method or process blocks may be omitted in some implementations. The methods and processes described herein are also not limited to any particular sequence, and the blocks or states relating thereto can be performed in other sequences that are appropriate, or may be performed in parallel, or in some other manner. Blocks or states may be added to or removed from the disclosed example embodiments. The performance of certain of the operations or processes may be distributed among computer systems or computers processors, not only residing within a single machine, but deployed across a number of machines.

As used herein, a circuit might be implemented utilizing any form of hardware, software, or a combination thereof. For example, one or more processors, controllers, ASICs, PLAs, PALs, CPLDs, FPGAs, logical components, software routines or other mechanisms might be implemented to make up a circuit. In implementation, the various circuits described herein might be implemented as discrete circuits or the functions and features described can be shared in part or in total among one or more circuits. Even though various features or elements of functionality may be individually described or claimed as separate circuits, these features and functionality can be shared among one or more common circuits, and such description shall not require or imply that separate circuits are required to implement such features or functionality. Where a circuit is implemented in whole or in part using software, such software can be implemented to operate with a computing or processing system capable of carrying out the functionality described with respect thereto, such as computer system 500.

As used herein, the term "or" may be construed in either an inclusive or exclusive sense. Moreover, the description of resources, operations, or structures in the singular shall not be read to exclude the plural. Conditional language, such as, among others, "can," "could," "might," or "may," unless specifically stated otherwise, or otherwise understood within the context as used, is generally intended to convey that certain embodiments include, while other embodiments do not include, certain features, elements and/or steps.

Terms and phrases used in this document, and variations thereof, unless otherwise expressly stated, should be construed as open ended as opposed to limiting. Adjectives such as "conventional," "traditional," "normal," "standard," "known," and terms of similar meaning should not be construed as limiting the item described to a given time period or to an item available as of a given time, but instead should be read to encompass conventional, traditional, normal, or standard technologies that may be available or known now or at any time in the future. The presence of broadening words and phrases such as "one or more," "at least," "but not limited to" or other like phrases in some instances shall not be read to mean that the narrower case is intended or required in instances where such broadening phrases may be absent.

What is claimed is:

1. A hardware accelerator, comprising:
    a resistor crossbar array, wherein the resistor crossbar array comprises a plurality of resistors each having a static conductance value; and
    a memristor coupled to an output line associated with the resistor crossbar array, wherein the memristor has a variable conductance value, and further wherein the static conductance values and the variable conductance value are set to calculate a matrix-vector multiplication associated with a weight matrix of a neural network.

2. The hardware accelerator of claim 1, wherein the resistor crossbar array comprises:
    a plurality of row lines;
    a plurality of column lines; and
    the plurality of resistors, wherein each of the plurality of resistors are coupled across an intersection of one of the plurality of row lines and one of the plurality of column lines.

3. The hardware accelerator of claim 2, wherein the static conductance values are set to coefficient values of a Discrete Cosine Transform (DCT).

4. The hardware accelerator of claim 3, wherein coefficients for the weight matrix of a neural network can be given by the DCT.

5. The hardware accelerator of claim 4, wherein the resistor crossbar array outputs a current value that is received by a multiplexer coupled to each of the plurality of column lines.

6. The hardware accelerator of claim 5, wherein an output of the multiplexer is received by the memristor coupled to the output line of the multiplexer.

7. The hardware accelerator of claim 6, wherein the memristor has a variable conductance value that is programmable.

8. The hardware accelerator of claim 7, wherein the memristor has a variable conductance value that is programmed in accordance with the DCT and output a value corresponding to the matrix-vector multiplication associated with a with a weight matrix of the neural network.

9. The hardware accelerator of claim 8, wherein the output value of the memristor corresponds to a solution of a computational problem mapped to the neural network.

10. The hardware accelerator of claim 9, wherein the neural network is emulated by the hardware accelerator.

11. A hybrid resistor-memristor crossbar array circuit for performing vector-matrix multiplication, comprising:
    a plurality of resistor crossbar arrays receiving voltage inputs representing a vector in the vector-matrix multiplication;
    a plurality of multiplexers, wherein each of the plurality of multiplexers is coupled to a corresponding resistor crossbar array of the plurality of crossbar arrays by a column line; and an array of memristors programmable such that the circuit performs a computation of the vector-matrix multiplication between a vector and a weighted matrix, wherein each memristor of the array of memristors is coupled to a corresponding multiplexer of the plurality of memristors by a column line.

12. The hybrid resistor-memristor crossbar array circuit of claim 11, wherein the resistors of the plurality of resistor crossbar arrays function as fixed conductance elements having a fixed conductance, and the memristors of the array of memristors function as variable conductance elements having the variable conductance.

13. The hybrid resistor-memristor crossbar array circuit of claim 12, wherein the fixed conductance of the plurality of resistors contributes a current.

14. The hybrid resistor-memristor crossbar array of claim 13, wherein each resistor crossbar from the plurality of resistor crossbar arrays outputs a summed current transposed matrix.

15. The hybrid resistor-memristor crossbar array circuit of claim 14, wherein the summed current from each of the plurality of resistor crossbar arrays are input into a corresponding multiplexer of the plurality of multiplexers.

16. The hybrid resistor-memristor crossbar array circuit of claim 15, wherein each multiplexer selects a summed current received as input to generate an output current from the multiplexer.

17. The hybrid resistor-memristor crossbar array circuit of claim 16, further comprising:
a resistor and transimpedance amplifier coupled to each multiplexer from the plurality of multiplexers, wherein the resistor and the transimpedance amplifier receives the output current from the corresponding multiplexer from the plurality of multiplexers and converts into a voltage.

18. The hybrid resistor-memristor crossbar array circuit of claim 17, wherein the fixed conductance of the resistors of the plurality of resistor crossbar arrays are set to a corresponding coefficient value of a Discrete Cosine Transform (DCT).

19. The hybrid resistor-memristor crossbar array circuit of claim 18, wherein each memristor from the plurality of memristors receives the voltage from the corresponding resistor and transimpedance amplifier as input, and applies a corresponding programmed conductance to the voltage to generate an output current.

20. The hybrid resistor-memristor crossbar array circuit of claim 19, wherein the output current from each memristor of the plurality of memristors are summed to generate a current value that represents an element of the calculation of the vector-matrix multiplication between the vector and the weighted matrix per-column such that each memristor generates an output current hybrid-resistor crossbar array circuit.

* * * * *